(12) United States Patent
Estrela et al.

(10) Patent No.: US 6,566,895 B2
(45) Date of Patent: May 20, 2003

(54) UNBALANCED THREE PHASE DELTA POWER MEASUREMENT APPARATUS AND METHOD

(75) Inventors: Peter Estrela, Fall River, MA (US); Edward W. Wilbur, Jr., Bristol, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/917,566

(22) Filed: Jul. 27, 2001

(65) Prior Publication Data

US 2003/0020452 A1 Jan. 30, 2003

(51) Int. Cl.[7] .................. G01R 29/00; G01R 31/05; H02J 3/00
(52) U.S. Cl. ............... 324/726; 324/547; 307/17
(58) Field of Search .............. 324/86, 107, 142, 324/140 R, 140 D, 726, 127, 547; 336/5, 173; 307/7, 17, 83

(56) References Cited

U.S. PATENT DOCUMENTS 5,276,402 A * 1/1994 Schucht ................. 324/107
6,128,583 A * 10/2000 Dowling ................ 324/772
6,154,036 A * 11/2000 Baldwin ................ 324/509

* cited by examiner

*Primary Examiner*—N. Le
*Assistant Examiner*—James Kerveros
(74) *Attorney, Agent, or Firm*—James M. Kasischke; Michael F. Oglo; Jean-Paul Nasser

(57) ABSTRACT

An apparatus and method are used to determine equivalent individual phase voltages and phase currents from an alternating delta power source and load configuration. A delta-wye input transformer and a wye-delta output transformer are interconnected between the delta power source and the delta power load. Each phase of the delta power source is effectively connected across a corresponding wye configured coil. The delta-wye input transformer and the wye-delta output transformer are electrically connected to each other in a manner thereby providing three conductors through which the individual phase currents through the wye coils may be directly measured. The phase voltages are preferably measured across the wye coils of either the input transformer or the output transformer not intermixed. The equivalent individual phase powers and individual power factors from the delta load can then be computed from the current and voltage measurements made using the wye configured coils in the delta-wye and wye-delta transformers.

19 Claims, 1 Drawing Sheet

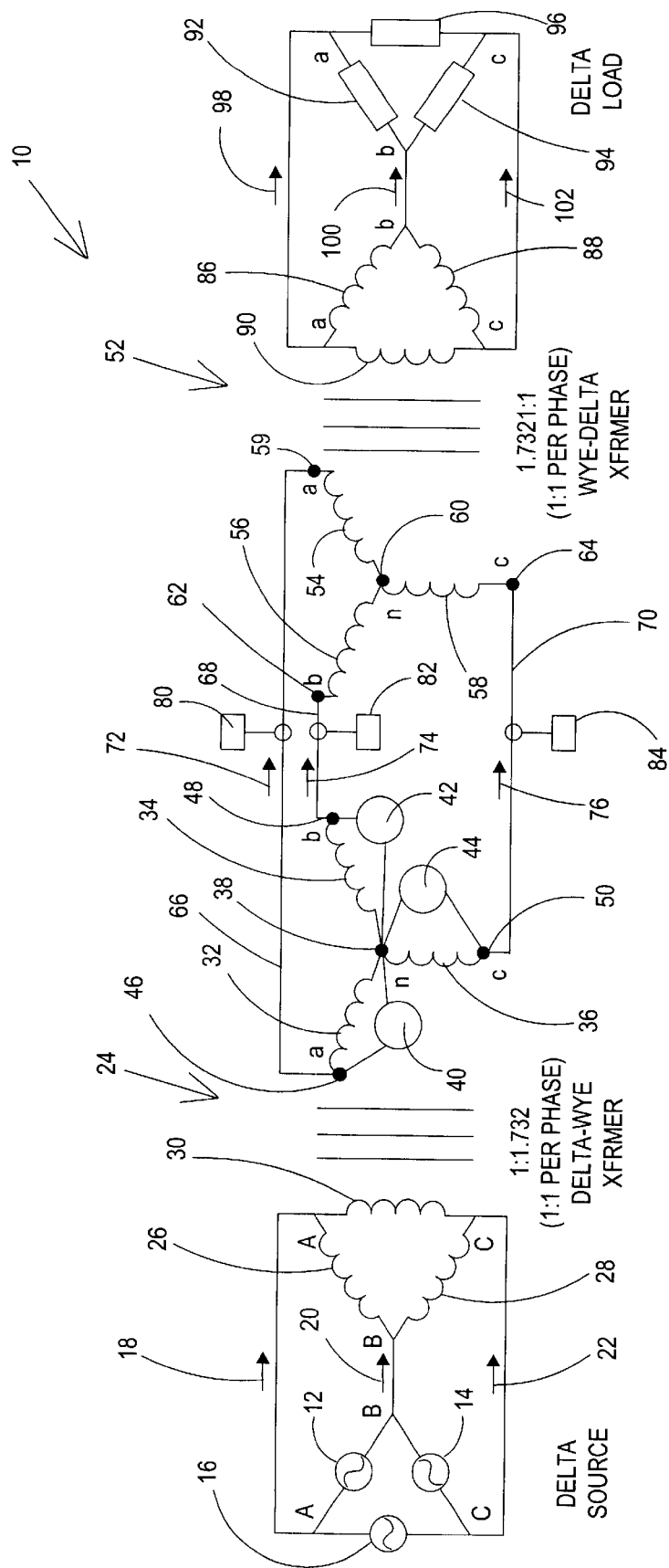

UNBALANCED THREE PHASE DELTA POWER MEASUREMENT APPARATUS AND METHOD

STATEMENT OF THE GOVERNMENT INTEREST

The invention described herein may be manufactured and used by or for the Government of the United States of America for governmental purposes without the payment of any royalties thereon or therefore.

CROSS-REFERENCE TO RELATED PATENT APPLICATIONS

Not applicable.

BACKGROUND OF THE INVENTION (1) Field of the Invention

The present invention relates generally to direct measurement of phase voltage and current parameters and, more specifically, to apparatus and method for measurement of individual phase power for unbalanced three-phase delta power configurations.

(2) Description of the Prior Art

In a submarine as well as in many commercial power configurations, three-phase power may be supplied only in a delta configuration. The measurement of individual phase power for unbalanced three phase delta loads requires that the individual phase voltage and current be accessible. Because delta power offers only phase voltage and line current, the required phase current is typically not available. An exception is the case where the load is made up of three sets of single phase loads and both conductors for each single-phase load are accessible. In the more typical situation where only phase voltage and line current are available, the determination of phase current given the line current is mathematically not possible due to unknown contributions of phase currents that form the resulting line currents. Moreover, in an unbalanced system the individual phases are not necessarily at a predetermined magnitude and phase relationship with each other thereby making presumptions based on incomplete information likely to be inaccurate.

It would be desirable to allow for direct measurement of unbalanced individual phase power and power factor for delta loads without internal intrusion into either the load or the source. Moreover, it would be desirable to provide a means for such direct measurement using commercially available components without the need for specially made elements.

Several of the following patents disclose prior art efforts to provide for power measurement systems but do not disclose a solution to the above problems.

U.S. Pat. No. 5,631,818, issued May 20, 1997 to Johnson et al, discloses a power supply system particularly adapted for use with an electrostatic precipitator providing substantially ripple-free DC power for improved precipitator operation. The power supply is adapted to receive three-phase AC power and to transform the AC power into high voltage DC power having a minimum of voltage ripple in the output. The power supply includes a multi-phase transformer having three primary windings, each of the primary windings having associated with it a pair of secondary windings. The primary windings can be either delta connected or wye connected. One of each of the secondary windings associated with one of the respective primary windings are connected together in a delta connection arrangement, and the remaining secondary windings are connected in a wye connection arrangement. Because the respective AC voltage outputs of each of the secondary windings is out of phase with the AC voltage outputs of the other secondary windings, the resultant combined DC output voltage, after the DC voltages have been rectified in a three phase, full-wave bridge rectifier stack, produces minimal ripple voltage and current, without requiring additional, more expensive, and less reliable components.

U.S. Pat. No. 4,896,106 issued Jan. 23, 1990 to Voisine and Gausegger, discloses a watt-hour meter, for a wye connected load, and includes a current transformer for sensing the load current, a resistive voltage divider network for sensing the line voltage, and a measuring circuit for calculating the AC electrical energy consumption of the load based on the sensed load current and line voltage. The load consumption calculations are performed using a Mark-Space oscillator and amplitude modulator in the watt transducer chip. Reduced voltage from the resistive voltage divider network is fed into the input junction of the Mark-Space oscillator. A feedback resistor is connected from the output junction to the input junction of the oscillator. The feedback resistor and the voltage divider network are mounted on the same thermally conductive substrate so that each is subject to the same thermal effects. Thus, any change, due to thermal effects, in the current through the voltage divider network seen at the input junction to the Mark-Space oscillator are compensated by a current change through the feedback line due to thermal effects on the feedback resistor. The watt-hour meter also includes an electronic register that receives the load consumption information from the watt transducer chip. The register is electrically isolated from the watt transducer chip and, therefore, from the voltage diver network, by an opto-isolator to reduce the possibility of electrical shock at the register. Power is provided to the watt transducer chip and the electronic register from the split secondary coils of a power transformer.

U.S. Pat. No. 3,944,919 issued Mar. 16, 1976 to Jewell et al, discloses a DC measuring circuit for power rectifiers wherein primary line current is utilized to measure direct current output. In the measuring circuit, line current transformers are connected to a multiphase instrument rectifier through a phase shifting current transformer which is adjustable to compensate for difference between the primary to secondary line current phase shift characteristic of the power transformer and any phase shift in the line current transformers. By such compensation, the average value of the rectified primary line current in the measuring circuit is maintained independent of the commutating angle of the rectified power current.

U.S. Pat. No. 5,691,634, issued Nov. 25, 1997, to C. S. Lowe, discloses a device for monitoring power in a wye power service having three phases including a sampling element arranged and configured to sample a current value and a voltage value from each of the three phases. A processor, coupled to said sampling element, calculates power either by using the current value and the voltage value for the phase when the voltage for that phase is available, or by using the current value for at least one phase and the voltage values for the other two phases.

U.S. Pat. No. 2,966,629, issued Dec. 27, 1960, to Downing et al., discloses a circuit for measuring an indication of total apparent power from a balanced system in which a delta transformer and a three-wire current sensing transformer are coupled between the source and load.

U.S. Pat. No. 2,071,834, issued Feb. 23, 1937, to E. L. Harder, discloses a wye-delta transformer for use with respect to alternating current impedance drop compensators.

In summary, while the above listed prior art shows various systems and power measurement means, the prior art does not show an apparatus or method for determining the individual phase currents provided from a delta source to a delta load or the means to determine individual phase powers and power factors.

Consequently, there remains a need for a system that allows for measurements of individual phase powers using commercially available components. Those skilled in the art will appreciate the present invention that addresses the above and other problems.

SUMMARY OF THE INVENTION

Accordingly, it is an object of the present invention to provide an apparatus and method for determining equivalent individual phase powers from an unbalanced delta power configuration.

It is another object of the present invention to provide apparatus and methods for directly measuring individual equivalent phase voltage and phase current from a delta power configuration.

It is yet another object of the present invention to use commercially available components to meet the above objects.

These and other objects, features, and advantages of the present invention will become apparent from the drawings, the descriptions given herein, and the appended claims.

An apparatus is disclosed for measuring equivalent individual phase voltages and phase currents from an alternating delta power source having a first delta source, a second delta source, and a third delta source. The delta power source provides power for use by a delta load circuit having a first delta load, a second delta load, and a third delta load. The apparatus comprises an input delta-wye transformer having a first delta input coil, a second delta input coil, a third delta input coil, a first wye input coil with a first wye input connection, a second wye input coil with a second wye input connection and a point connection electrically connects the first wye input coil and the second wye input coil and the third wye input coil. The first wye input coil may be inductively coupled to the first delta input coil, the second wye input coil is inductively coupled to the second delta input coil, and the third wye input coil may be inductively coupled to the third delta input coil. The first delta input coil is connected across the first delta source, the second delta input coil across the second delta source, and the third delta input coil across the third delta source.

An output wye-delta transformer has a first wye output coil with a first wye output connection, a second wye output coil with a second wye output connection, a third wye output coil with a third wye output connection, a first delta output coil, a second delta output coil, and a third delta output coil. The first wye output coil is inductively coupled to the first delta output coil, the second wye output coil is inductively coupled to the second delta output coil, the third wye output coil is inductively coupled to the third delta output coil. The first delta output coil is connected across the first delta load, the second delta output coil across the second delta load, and the third delta output coil across the third delta load.

A first current conductor, a second current conductor, and a third current conductor are provided. The first current conductor electrically connects the first wye input connection and the first wye output connection. The second current conductor electrically connects the second wye input connection and the second wye output connection. The third current conductor electrically connects the third wye input connection and the third wye output connection.

A first current probe is used for measuring current through the first current conductor connecting the input wye to the output wye, a second current probe for measuring current through the second current conductor connecting the input wye to the output wye, and a third current probe for measuring current through the third current conductor connecting the input wye to the output wye.

A first voltage probe, a second voltage probe, and a third voltage probe are provided for preferably measuring a first voltage and a second voltage and a third voltage related to at least one of the input delta-wye transformer or the output wye-delta transformer.

In other words, a first set of coils is connected in a delta configuration wherein the first set of coils comprises a first delta output coil, a second delta output coil, and a third delta output coil. A second set of coils is connected in a wye configuration wherein the second set of coils comprises a first wye input coil with a first wye input connection, a second wye input coil with a second wye input connection and a third wye input coil with third wye input connection. A third set of coils is connected in a wye configuration wherein the third set of coils comprises a first wye output coil with a first wye output connection, a second wye output coil with a second wye output connection, and a third wye output coil with a third wye output connection. A fourth set of coils is connected in a delta configuration wherein the fourth set of coils comprising a first delta output coil, a second delta output coil, and a third delta output coil. A first current conductor, a second current conductor, and a third current conductor are provided. The first current conductor electrically connects the first wye input connection and the first wye output connection. The second current conductor electrically connects the second wye input connection and the second wye output connection. The third current conductor electrically connects the third wye input connection and the third wye output connection. As before, the first current probe measures current through the first current conductor, the second current probe measures current through the second current conductor, and a third current probe measures current through the third current conductor.

In operation, a method is provided for measuring individual phase voltages and phase currents. Using the equipment described hereinbefore, a first phase current is measured through the first current conductor. A second phase current is measured through the second current conductor. A third phase current is measured through the third current conductor. A first phase voltage is preferably measured from the input delta-wye transformer across the first input wye coil. A second phase voltage is preferably measured from the input delta-wye transformer, across the second input wye coil. A third phase voltage is preferably measured from the input delta-wye transformer, across the third input wye coil. If desired, the phase powers can be determined from the phase voltage and current parameters. A first phase power is determined from the first phase current and the first phase voltage. A second phase power is determined from the second phase current and the second phase voltage. A third phase power is determined from the third phase current and third phase voltage. A total power may be determined from the first phase power and the second phase power and the third phase power. Moreover, a first phase power factor may be determined from the first phase current and the first phase voltage. A second phase power factor may be determined from the second phase current and the second phase voltage. A third phase power factor may be determined from the third phase current and third phase voltage.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein corresponding reference characters indicate corresponding parts throughout the several views of the drawings and wherein: a single FIGURE is a circuit diagram showing a delta source and delta load with components for directly measuring the individual phase voltages and phase currents in accord with the present invention.

BRIEF DESCRIPTION OF THE PREFERRED EMBODIMENTS

Referring now to the drawings and, more particularly, to the FIGURE there is shown a system 10 in accord with the present invention. A delta alternating current power source includes delta source 12 developed between points A and B, delta source 14 developed between points B and C, and delta source 16 developed between points A and C. The source produces line currents 18, 20, and 22 however it is not possible to know the individual phase currents.

Input delta-wye transformer 24 includes delta input coils 26, 28, and 30 connected in a delta configuration. Delta input coil 26 is connected across points A and B so as to be connected across delta source 12. Delta input coil 28 is connected across points B and C so as to be connected across delta source 14. Likewise, delta input coil 30 is connected across points A and C so as to be connected across delta source 16. The secondary of input delta-wye transformer 24 includes wye input coils 32, 34, and 36. The turns ratio of input delta-wye transformer 24 is one-to-one with corresponding delta input coils being connected across corresponding wye input coils. For instance, delta input coil 26 may be inductively coupled to wye input coil 34. Delta input coil 30 may be inductively coupled to wye input coil 32. Delta input coil 28 may be inductively coupled to wye input coil 36. One end of each wye input coil 32, 34, and 36 are connected at a common neutral point 38. An effective phase voltage is therefore induced between neutral point 38 and opposite ends or wye input connections 46, 48, and 50 for each wye input coil. These voltages are found between points a and n, b and n, and c and n across corresponding wye input coils 32, 34, and 36. Voltage probes 40, 42, and 44 may then measure these phase voltages. These phase voltages correspond to the delta phase voltages.

Output wye-delta transformer 52 is then utilized in conjunction with delta-wye transformer 24 to determine the phase currents. Output wye-delta transformer 52 includes wye output coils 54, 56, and 58. Wye output coils 54, 56, and 58 have a common neutral point 60. Wye output coils 54, 56, and 58 each have a wye output connection on the opposite side of neutral point 60 which are numbered as 59, 62, and 64 at points a, b, and c, respectively. Conductor 66 electrically connects between wye input connection 46 and wye output connection 59. Conductor 68 electrically connects between wye input connection 48 and wye output connection 62. Finally, conductor 70 electrically connects between wye input connection 50 and wye output connection 64. Respective phase currents 72, 74, and 76 flow through respective conductors 66, 68, and 70. Phase currents 72, 74, and 76 can now be directly measured using respective current probes 80, 82, and 84. The phase currents measured now correspond to the measured phase voltages across the input wye coils which in turn correspond to the delta phase voltages.

Wye output coils are inductively coupled to corresponding delta output coils 86, 88, and 90 through one to one per phase wye-delta output transformer 52. Thus for example, wye output coil 54 may be inductively coupled to delta output coil 90. Wye output coil 56 may be inductively coupled to delta output coil 86. Wye output coil 58 may be inductively connected to delta output coil 88. Delta output coils 86, 88, and 90 are then connected across corresponding delta loads 92, 94, and 96. Line currents 98, 100, and 102 now correspond to line currents 18, 20, and 22.

With the information discussed above from circuit 10 in accord with the present invention, the power output and power factors for each phase can be determined. The total power output can be determined by adding the power outputs of each phase.

In summary, delta-wye input transformer 24 is connected to the delta alternating source. At this point, the line currents but not the phase currents are available. Wye-delta output transformer 52 is electrically connected to delta-wye input transformer 24 via conductors 66, 68, and 70. Current probes 80, 82, and 84 can measure individual phase currents associated with corresponding phase voltages of wye input coils 32, 34, and 36. The various phase voltage measurements could be made in other places such as across the output wye coils. There may be some slight differences with the delta phase voltages due to losses, harmonics, and the like although phase voltages could also be measured across the delta source phases or delta load phases. Various types of current and voltage probes and/or combinations of the two could be used.

Therefore, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. An apparatus for measuring individual phase voltages and phase currents from a delta power source having a first delta source, a second delta source, and a third delta source, for use by a delta load circuit having a first delta load, a second delta load, and a third delta load, said apparatus comprising:

an input delta-wye transformer having a first delta input coil, a second delta input coil, a third delta input coil, a first wye input coil with a first wye input connection, a second wye input coil with a second wye input connection and a third wye input coil with third wye input connection, a neutral point connection of said first wye input coil and said second wye input coil and said third wye input coil, said first delta input coil being connected across said first delta source, said second delta input coil being connected across said second delta source, and said third delta input coil being connected across said third delta source;

an output wye-delta transformer having a first wye output coil with a first wye output connection, a second wye output coil with a second wye output connection, and a third wye output coil with a third wye output connection, a first delta output coil, a second delta output coil, and a third delta output coil, said first delta output coil being connected across said first delta load, said second delta output coil being connected across said second delta load, and said third delta output coil being connected across said third delta load;

a first current conductor, a second current conductor, and a third current conductor, said first current conductor electrically connecting said first wye input connection and said first wye output connection, said second current conductor electrically connecting said second wye input connection and said second wye output connection, and said third current conductor electrically connecting said third wye input connection and said third wye output connection; and a first current probe for measuring current through said first current conductor, a second current probe for measuring current through said second current conductor, and a third current probe for measuring current through said third current conductor.

2. The apparatus of claim 1 further comprising a first voltage probe, a second voltage probe, and a third voltage probe for measuring a first voltage and a second voltage and a third voltage related to at least one of said input delta-wye transformer or said output wye-delta transformer.

3. The apparatus of claim 2 further comprising said first voltage probe being connected between said neutral point connection and said first wye input connection, said second voltage probe being connected between said neutral point connection and said second wye input connection, and said third voltage probe being connected between said neutral point connection and said third wye input connection.

4. The apparatus of claim 1 wherein said input delta-wye transformer has a one-to-one ratio per phase.

5. The apparatus of claim 1 wherein said output wye-delta transformer has a one-to-one ratio per phase.

6. The apparatus of claim 1 further comprising said first wye input coil being inductively coupled to said first delta input coil, said second wye input coil being inductively coupled to said second delta input coil, and said third wye input coil being inductively coupled to said third delta input coil.

7. The apparatus of claim 1 further comprising said first wye output coil being inductively coupled to said first delta output coil, said second wye output coil being inductively coupled to said second delta output coil, said third wye output coil being inductively coupled to said third delta output coil.

8. An apparatus for measuring equivalent individual phase voltages and phase currents from a delta power source having a first delta source, a second delta source, and a third delta source, for use by a delta load circuit having a first delta load, a second delta load, and a third delta load, said apparatus comprising:

a first set of coils connected in a delta configuration, said first set of coils comprising a first delta input coil, a second delta input coil, and a third delta input coil, said first delta input coil being connected across said first delta source, said second delta input coil being connected across said second delta source, and said third delta input coil being connected across said third delta source;

a second set of coils connected in a wye configuration, said second set of coils comprising a first wye input coil with a first wye input connection, a second wye input coil with a second wye input connection and a third wye input coil with third wye input connection, a neutral point connection of said first wye input coil and said second wye input coil and said third wye input coil;

a third set of coils connected in a wye configuration, said third set of coils comprising a first wye output coil with a first wye output connection, a second wye output coil with a second wye output connection, and a third wye output coil with a third wye output connection;

a fourth set of coils connected in a delta configuration, said fourth set of coils comprising a first delta output coil, a second delta output coil, and a third delta output coil, said first delta output coil being connected across said first delta load, said second delta output coil being connected across said second delta load, and said third delta output coil being connected across said third delta load;

a first current conductor, a second current conductor, and a third current conductor, said first current conductor electrically connecting said first wye input connection and said first wye output connection, said second current conductor electrically connecting said second wye input connection and said second wye output connection, and said third current conductor electrically connecting said third wye input connection and said third wye output connection; and a first current probe for measuring current through said first current conductor, a second current probe for measuring current through said second current conductor, and a third current probe for measuring current through said third current conductor.

9. The apparatus of claim 8 further comprising a first voltage probe being connected between said neutral point connection and said first wye input connection, a second voltage probe being connected between said neutral point connection and said second wye input connection, and a third voltage probe being connected between said neutral point connection and said third wye input connection.

10. The apparatus of claim 8 wherein said first set of coils and said second set of coils comprise an input delta-wye transformer.

11. The apparatus of claim 10 wherein said input delta-wye transformer has a one-to-one ratio per phase.

12. The apparatus of claim 8 wherein said third set of coils and said fourth set of coils comprise an output wye-delta transformer.

13. The apparatus of claim 12 wherein said output wye-delta transformer has a one-to-one ratio per phase.

14. A method for measuring equivalent individual phase voltages and phase currents from a delta power source having a first delta source, a second delta source, and a third delta source, for use by a delta load circuit having a first delta load, a second delta load, and a third delta load, said method comprising the steps of:

providing an input delta-wye transformer having a first delta input coil, a second delta input coil, and a third delta input coil, a first wye input coil with a first wye input connection, a second wye input coil with a second wye input connection, and a third wye input coil with third wye input connection;

providing an output wye-delta transformer having a first wye output coil with a first wye output connection, a second wye output coil with a second wye output connection, and a third wye output coil with a third wye output connection, a first delta output coil, a second delta output coil, and a third delta output coil;

connecting said first delta input coil across said first delta source, said second delta input coil across said second delta source, and said third delta input coil across said third delta source;

connecting said first delta output coil across said first delta load, said second delta output coil across said second delta load, and said third delta output coil across said third delta load;

providing a first current conductor, a second current conductor, and a third current conductor;

electrically connecting said first current conductor between said first wye input connection and said first wye output connection, said second current conductor between said second wye input connection and said second wye output connection, and said third current conductor between said third wye input connection and said third wye output connection; and measuring a first phase current through said first current conductor;

measuring a second phase current through said second current conductor; and measuring a third phase current through said third current conductor.

15. The apparatus of claim 14 further comprising:

measuring a first phase voltage from said input delta-wye transformer wye winding;

measuring a second phase voltage from said input delta-wye transformer wye winding; and measuring a third voltage from said input delta-wye transformer wye winding.

16. The apparatus of claim 15 further comprising:

measuring a first phase voltage between said neutral point connection and said first wye input connection;

measuring a second phase voltage between said neutral point connection and said second wye input connection; and measuring a third phase voltage probe between said neutral point connection and said third wye input connection.

17. The method of claim 15 further comprising:

determining a first phase power from said first phase current and said first phase voltage;

determining a second phase power from said second phase current and said second phase voltage; and determining a third phase power from said third phase current and third phase voltage.

18. The method of claim 17 further comprising determining a total power from said first phase power and said second phase power and said third phase power.

19. The method of claim 16 further comprising:

determining a first phase power factor from said first phase current and said first phase voltage;

determining a second phase power factor from said second phase current and said second phase voltage; and determining a third phase power factor from said third phase current and third phase voltage.

* * * * *